(12) United States Patent
Li

(10) Patent No.: US 6,943,638 B1
(45) Date of Patent: Sep. 13, 2005

(54) VOLTAGE CONTROLLED OSCILLATOR AND ELECTRONIC SYSTEM USING THE SAME

(75) Inventor: Yan-Liang Li, Fongshan (TW)

(73) Assignee: Toppoly Optoelectronics Corp., Chu-Nan (TW)

( * ) Notice: Subject to any disclaimer, the term of this patent is extended or adjusted under 35 U.S.C. 154(b) by 0 days.

(21) Appl. No.: 11/031,216

(22) Filed: Jan. 7, 2005

(51) Int. Cl.$^7$ .............................. H03B 5/20; H03B 5/24
(52) U.S. Cl. .................................. 331/144; 331/177 R
(58) Field of Search .............................. 331/74, 113 R, 331/143, 144, 145, 177 R

(56) References Cited

U.S. PATENT DOCUMENTS 5,570,307 A * 10/1996 Takahashi .................. 708/256
6,157,265 A * 12/2000 Hanjani ....................... 331/49
6,236,280 B1 * 5/2001 Allee .......................... 331/111

* cited by examiner

Primary Examiner—David Mis
(74) Attorney, Agent, or Firm—Liu & Liu

(57) ABSTRACT

A voltage controlled oscillator comprises two XOR logic units and two inverters. A first inverter inverts a first XOR result into a first output signal; a second inverter inverts a second XOR result into a second output signal; a first XOR logic unit performs an XOR logic operation based on an input signal and the second output signal and thus generating the first XOR result; and a second XOR logic unit performs an XOR logic operation based on the first output signal and a reference voltage and thus generates the second XOR result.

5 Claims, 1 Drawing Sheet

VOLTAGE CONTROLLED OSCILLATOR AND ELECTRONIC SYSTEM USING THE SAME

BACKGROUND OF THE INVENTION

1. Field of Invention

The present invention relates to a voltage controlled oscillator. More particularly, the present invention relates to a voltage controlled oscillator employing XOR logic unit, and electronic system using the same.

2. Description of Related Art

The construction of a conventional voltage controlled oscillator is explained referring to FIG. 1. Generally, a voltage control oscillator (VCO) 10 has a plurality of inverters 100, 102 and 104, which are connected in series, a plurality of resistors 110, 112, 114 and 116, and a capacitor 120. A supply voltage VDD (which is not shown) applied to the inverters 100, 102 and 104 makes the inverters 100, 102 and 104 output signals in response to voltage inputs to respective inverters, wherein the respective output signals are either input to downstream inverters or output of the VCO 10 as the case may be.

However, the conventional voltage control oscillator 10 has the following problems. The maximum frequency output from the VCO can only be obtained when the input voltage equals to VDD/2. Therefore, the output range of the frequency is limited. Further, many passive units are required to be used and these passive units together determine the maximum frequency.

SUMMARY OF THE INVENTION

One of the objects of this invention is to provide a voltage controlled oscillator and an electronic system using the same so that the maximum output frequency is not limited by the passive units.

Another object of this invention is to provide a voltage controlled oscillator, and an electronic system using the same so that the output frequency increases along with the increase of the input voltage.

To achieve the above and other objects, this invention provides a voltage controlled oscillator, comprising a first inverter for inverting a first XOR result into a first output signal; a second inverter for inverting a second XOR result into a second output signal; a first XOR logic unit for performing an XOR logic operation based on an input signal and the second output signal and thus generating the first XOR result; and a second XOR logic unit for performing an XOR logic operation based on the first output signal and a reference voltage and thus generating the second XOR result.

In one embodiment, the voltage controlled oscillator further comprises a third XOR logic unit for performing an XOR logic operation based on the first output signal and the second output signal and thus generating a third XOR result.

The present invention provides an electronic system, comprising a power source, a signal source and a voltage controlled oscillator. The power source provides a reference voltage. The signal source provides a signal. The voltage controlled oscillator comprises a first inverter for inverting a first XOR result into a first output signal; a second inverter for inverting a second XOR result into a second output signal; a first XOR logic unit for performing an XOR logic operation based on an input signal and the second output signal and thus generating the first XOR result; and a second XOR logic unit for performing an XOR logic operation based on the first output signal and a reference voltage and thus generating the second XOR result.

Accordingly, the voltage controlled oscillator provided by the present invention output higher frequency when the input voltage becomes higher.

It is to be understood that both the foregoing general description and the following detailed description are exemplary, and are not intended to limit the explanation of this invention as claimed.

BRIEF DESCRIPTION OF THE DRAWINGS

The accompanying drawings are included to provide a further understanding of this invention, and are incorporated herein and constitute a part of this specification. The drawings illustrate embodiments of this invention and, together with the description, serve to explain the principles of this invention.

DESCRIPTION OF THE PREFERRED EMBODIMENTS

Figure 1:
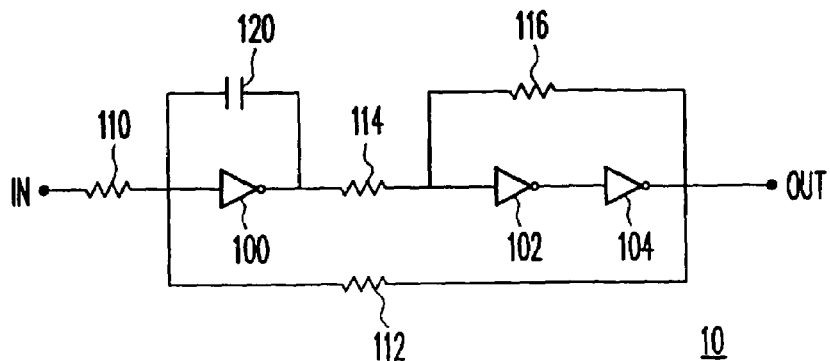
FIG. 1 is a circuitry diagram of a voltage controlled oscillator according to prior art.

Reference will now be made in detail to the present preferred embodiments of this invention, examples of which are illustrated in the accompanying drawings. Wherever possible, the same reference numbers are used in the drawings and the description to refer to the same or like parts.

Figure 2:
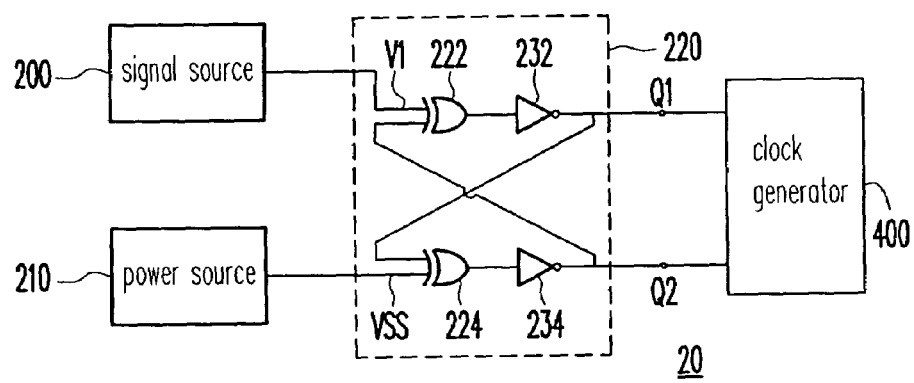
FIG. 2 is a block diagram of an electronic system with a voltage controlled oscillator according to an embodiment of the present invention.

Referring to FIG. 2, which is a block diagram of an electronic system with a voltage controlled oscillator according to an embodiment of the present invention. In this embodiment, the electronic system 20 includes a signal source 200, a power source 210 and a voltage controlled oscillator (VCO) 220, as well as a clock generator 400 for example. The signal source 200 provides a signal V1 to the VCO 220 while the power source 210 provides a reference voltage VSS to the VCO 220. The VCO 220 includes two XOR logic units 222, 224 and two inverters 232, 234. The XOR logic unit 222 receives the signal V1 and the output signal Q2, performs an XOR logic operation based on these data and generates a first XOR result, which is inverted by the inverter 232 to be the output signal Q1. The XOR logic unit 224 receives the output signal Q1 from the output of the inverter 232 and the reference voltage VSS, performs an XOR logic operation based on these data and generates a second XOR result, which is inverted by the inverter 234 to be the output signal Q2.

When the XOR logic unit 222 receives a rising edge, i.e. from logic 0 to logic 1, from the signal V1, the VCO 220 starts to operate. On receiving the rising edge, XOR logic unit 222 performs an XOR logic operation and generates logic 1 to the input of the inverter 232 because the output signal Q2 is logic 0 at the beginning. The inverter 232 therefore outputs logic 0 as the output signal Q1. Thereafter, the output signal Q1 is input to the XOR logic unit 224. The XOR logic unit 224 performs an XOR logic operation based on the output signal Q1 and the reference voltage VSS and thus generates another XOR result. If the reference voltage VSS is logic 0, the XOR result output from the XOR logic unit 224 will be logic 0 when the output signal Q1 is logic 0. Therefore, the inverter 234 inverts the XOR result output from the XOR logic unit 224 and generates logic 1 as the output signal Q2. Once the output signal Q2 is logic 1 and the signal V1 remains on logic 1, the output signal Q1 turns to logic 1. Thereafter, output signal Q2 turns to logic 0 because one input of the XOR logic unit 224 is logic 1 and another input of the XOR logic unit 224 is logic 0.

Based upon the structure of this embodiment, the frequencies of the output signals Q1 and Q2 increase as the input voltage V1 increases, and the phase delay between output signals Q1 and Q2 is about ¼ time period of the input signal V1. For example, when the input signal V1 is a pulse with 5V amplitude and 100 KHz frequency, the VCO 220 may generate two output signals Q1 and Q2 each having a frequency of about 6250 Hz. At the same situation, when the input signal V1 is a pulse with 10V amplitude and 100 KHz frequency, the two output signals Q1 and Q2 each has a frequency of about 12500 KHz.

Figure 3:
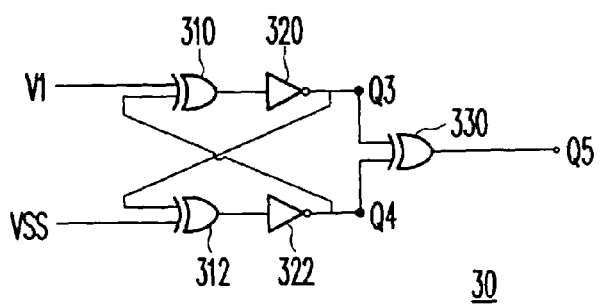
FIG. 3 is a circuitry diagram of a voltage controlled oscillator according to another embodiment of the present invention.

Referring to FIG. 3, a circuitry diagram of a voltage controlled oscillator according to another embodiment of the present invention is illustrated. In this embodiment, VCO 30 includes three XOR logic units 310, 312, 330, and two inverters 320,322. Operations of XOR logic units 310,312 and inverters 320,322 are the same as that stated in the previous embodiment. Accordingly, the output signals Q3 and Q4 are the same as Q1 and Q2, respectively. The XOR logic unit 330 performs an XOR logic operation based on Q3 and Q4. Because a small phase difference exists between Q3 and Q4, the frequency of the output signal Q5 is twice of the frequency of Q3 or Q4. Accordingly, the XOR logic unit 330 functions as a frequency doubler.

The present invention therefore provides a voltage controlled oscillator and an electronic system using the voltage controlled oscillator that outputs a higher frequency when a higher voltage is input to the voltage controlled oscillator. The maximum frequency of the output signal therefore is not limited as what happened in the prior art.

It will be apparent to those skilled in the art that various modifications and variations can be made to the structure of the present invention without departing from the scope or spirit of this invention. For example, while the figures and accompanying description refer to the structure and functions of discrete logic units and inverters and their functional relationships in the described embodiments, two of more of these functional components may be physically embodied in a single component that comprises the functionality of the underlying functional components to provide similar results. The functional components may be embodied in an integrated circuit, for example. In view of the foregoing descriptions, it is intended that the present invention covers various modifications and variations if they fall within the scope of the following claims and their equivalents.

What is claimed is:

1. A voltage controlled oscillator, comprising:
a first logic unit for performing an XOR logic operation based on an input signal and a second output signal to generate a first XOR result;
a first inverter for inverting the first XOR result into a first output signal;
a second logic unit for performing an XOR logic operation based on the first output signal and a reference voltage to generate a second XOR result; and
a second inverter for inverting the second XOR result into the second output signal.

2. The voltage control oscillator of claim 1, further comprising:
a third XOR logic unit for performing an XOR logic operation based on the first output signal and the second output signal to generate a third XOR result.

3. An electronic system, comprising:
a power source, providing a reference voltage;
a signal source for providing a signal;
a processor; and
a voltage controlled oscillator as in claim 1, providing an output which is operationally coupled to the processor.

4. The electronic system of claim 3, wherein the voltage controlled oscillator further comprising:
a third XOR logic unit for performing an XOR logic operation based on the first output signal and the second output signal to generate and thus generating a third XOR result.

5. A voltage controlled oscillator, comprising:
a first logic unit having a first input signal and a second input signal, said first logic unit performing an XOR logic operation based on the first input signal and the second input signal to generate a first XOR result;
a first inverter having the first XOR result as an input, said first inverter inverting the first XOR result into a first output signal;
a second logic unit having the first output signal and a reference voltage as inputs, said second logic unit performing an XOR logic operation based on the first output signal and the reference voltage to generate a second XOR result; and
a second inverter having the second XOR result as an input, said second inverter inverting the second XOR result into a second output signal, wherein the second input signal to the first logic unit comprises the second output signal.

* * * * *